United States Patent [19]
Robinson

[11] Patent Number: 5,387,877
[45] Date of Patent: Feb. 7, 1995

[54] VOLTAGE CONTROLLED ATTENUATOR FOR SPEAKERPHONES

[75] Inventor: Neil Robinson, Sunnyvale, Calif.

[73] Assignee: Exar Corporation, San Jose, Calif.

[21] Appl. No.: 137,237

[22] Filed: Oct. 14, 1993

Related U.S. Application Data

[62] Division of Ser. No. 78,716, Jun. 17, 1993, Pat. No. 5,319,704.

[51] Int. Cl.$^6$ .............................................. H03G 3/30
[52] U.S. Cl. ................................... 330/254; 330/257; 330/284
[58] Field of Search ..................... 330/254, 257, 284

[56] References Cited

U.S. PATENT DOCUMENTS

| | | | |
|---|---|---|---|
| 4,264,873 | 4/1981 | Kominami et al. | 330/288 X |
| 4,727,335 | 2/1988 | Yokoyama | 330/254 |
| 5,157,350 | 10/1992 | Rubens | 330/254 |

FOREIGN PATENT DOCUMENTS 46313  4/1981  Japan .................. 330/254

Primary Examiner—James B. Mullins
Attorney, Agent, or Firm—Townsend and Townsend Khourie and Crew

[57] ABSTRACT

An integrated circuit voltage controlled attenuator which reduces control voltage feedthrough by employing NPN transistors for both sets of current steering elements is disclosed. A pair of emitter coupled NPN transistors are provided, connected to a common current source. The collector currents of these transistors form input currents of two precision PNP current mirrors. Output currents from the mirrors are coupled to a second pair of emitter coupled NPN transistors, having a current source connected to their emitters, whose value is adjusted by feedback to exactly match the sum of output currents of the precision mirrors. A single set of control voltages is supplied to both sets of emitter coupled NPN transistors. Signal input and output current is coupled from the precision current source output legs and made available in voltage form through operational amplifiers which perform input voltage to current, and output current to voltage conversions, respectively. An integrated control voltage generation technique is also disclosed, which provides accurate gain settings for a voltage controlled attenuator without the need for absolute value external components or signal feedback between the voltage controlled attenuator and control circuit.

8 Claims, 8 Drawing Sheets

VOLTAGE CONTROLLED ATTENUATOR FOR SPEAKERPHONES

This is a division of application Ser. No. 08/078,716 filed Jun. 17, 1993, and now U.S. Pat. No. 5,319,704.

BACKGROUND OF THE INVENTION

The present invention relates to voltage controlled attenuator circuits, and a means to provide accurate gain settings for such attenuators. In particular, the invention relates to such circuits for use in integrated circuit speakerphone systems.

Voltage controlled attenuators find applications in a wide variety of systems, to adjust the amplitude of signals passed through such systems according to the magnitude of a control signal. For example, in a speakerphone circuit, attenuators are included in both the transmit and receive channels to provide half duplex communication. The transmit and receive attenuators are typically operated in a complementary manner, while one is at maximum gain the other is at maximum attenuation and vice versa. The setting of each attenuator is adjusted so that the difference between the levels remains the same. Using this technique a constant loss is inserted between the two channels and prevents instability that would otherwise occur, due to signal coupling between the loudspeaker and microphone, or sidetone through a hybrid circuit. One requirement of attenuators used in a such an arrangement is accurate gain settings to ensure consistent performance of the speakerphone system. Large variations of the gain level of each attenuator makes the inserted loss between the two channels unpredictable and presents difficulties maintaining the stability of the system.

In a typical speakerphone, the gain setting of a channel is dependent upon the detection of speech within that channel. If a far end talker is speaking, the receive signal is greater than the transmit signal, and the transmit attenuator should be set to maximum loss while the receive attenuator is set to maximum gain. The reverse is true if the mirror-end talker is speaking. By monitoring the amplitudes of the signals in both channels, a control circuit may be developed to determine which channel is active and adjust the gains accordingly. A further requirement of an attenuator used in a speakerphone is the need to minimize the feedthrough of control signal into the audio path. Feedthrough generates an audible "thump" in the speech channel which occurs when switching from one channel to the other. With sufficient magnitude, the feedthrough causes errors in switching due to its detection as a false speech signal. The primary source of feedthrough is gain dependent offset within the attenuator.

FIG. 2 illustrates an example of a prior art voltage controlled attenuator. An input voltage is provided at a point 210 through a resistor R2 to a first amplifier 212. Amplifier 212 operates to sink the current from emitter coupled transistors 218,220 and 214, 216 which receive current from a current source 222. The output is provided through a second amplifier 224 to a voltage output 226. A control voltage indicated VC is applied to transistor 214 and transistor 220. The control voltage VC affects the two transistors in opposite ways, one being NPN, the other PNP. In response to an increasing control voltage, the current in transistor 214 will increase while the current in transistor 220 will decrease. Thus, the current through the two legs of the amplifier section will split in proportion with the control voltage. In accordance with this varying current, the voltage amplification between the input at point 210 and the output at point 226 will vary, such that the gain of the attenuator is directly proportional to the split of the current from current source 222.

One problem with a circuit such as that shown in FIG. 2, when used in a typical bipolar integrated circuit, is the different characteristics of the NPN and PNP transistors, which causes a DC feedthrough from the input to the output and which varies in accordance with the level of amplification set by the control voltage. It would be desirable to have a voltage controlled attenuator which eliminates this DC feedthrough effect due to the use of both NPN and PNP transistors in the current splitting core.

SUMMARY OF THE INVENTION

The present invention provides a voltage controlled attenuator and gain control mechanism which reduces DC feedthrough by using NPN transistors exclusively to perform current splitting in the voltage controlled attenuator core. Also, a gain control voltage generator is disclosed which makes use of the accuracy of component matching in integrated circuit technology, independently of process variations, to generate a precise control voltage without the need for external components, on chip trimming, or complex feedback mechanisms. In the voltage controlled attenuator, a pair of emitter coupled NPN transistors are provided, connected to a common current source. The current flow in each of the NPN transistors is mirrored by a matched PNP current mirror, to a second set of matched NPN transistors which are also emitter coupled. A common control voltage, which is preferably differential, is connected to the emitter coupled NPN pairs. A feedback control loop adjusts the current in the second set of emitter coupled NPN transistors such that the sum of currents from the second NPN pair is equal to that of the first pair. Signal input and output are connected to the collectors of the second NPN pair. The arrangement of the voltage controlled attenuator defines the current flow through the PNP devices with NPN devices, thereby providing independence of the PNP characteristics in the current splitting core.

In the gain control voltage generator, two pairs of emitter coupled NPN transistors are provided, each connected to a common current source, providing a current in each pair proportional to the current in the voltage controlled attenuator core. Resistors, with a value ratio of NR:R and R:NR, are connected in the collector circuits of each NPN pair. Feedback from each resistor pair to a common rate control capacitor and differential amplifier is provided such that the voltage difference appearing across either set of resistors may be set to zero in response to the detection of receive or transmit signals in the speakerphone. A resulting gain control voltage is generated at the input of the active NPN pair, which, when connected to the control inputs of the attenuator core, produces a voltage gain inversely proportional to the ratio of the resistors in the active pair of the control voltage generator. This arrangement provides a control voltage which is accomplished without a DC feedback loop from the attenuators, such as set forth in U.S. Pat. No. 4,720,856.

For a fuller understanding of the nature and advantages of the invention, reference should be made to the ensuing detailed description, taken in conjunction with the accompanying drawings.

BRIEF DESCRIPTIONS OF THE DRAWINGS

DESCRIPTION OF SPECIFIC EMBODIMENTS

Figure 1:
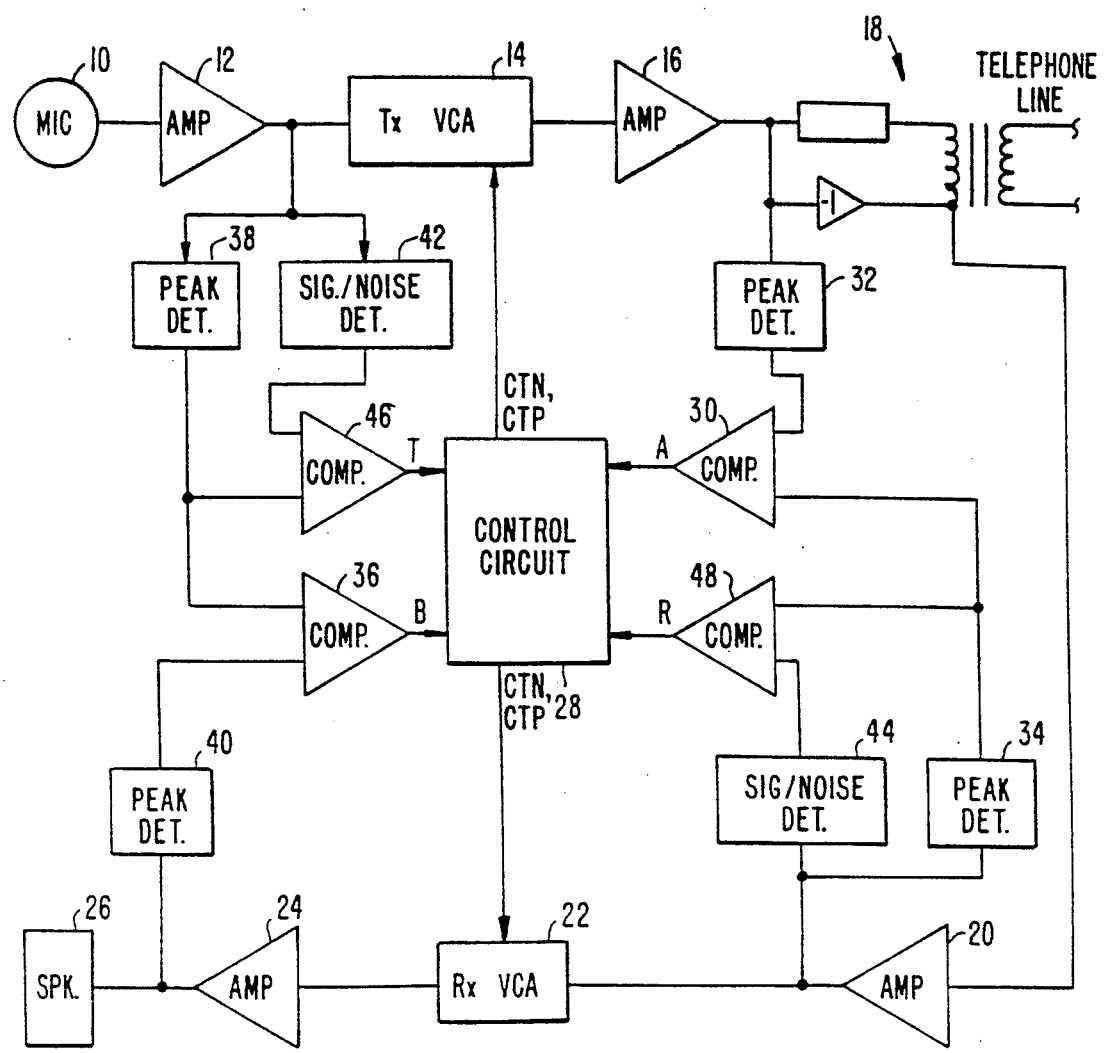
FIG. 1 is a block diagram of a four-point sensing circuit for a speakerphone using voltage controlled attenuators.
Figure 2:
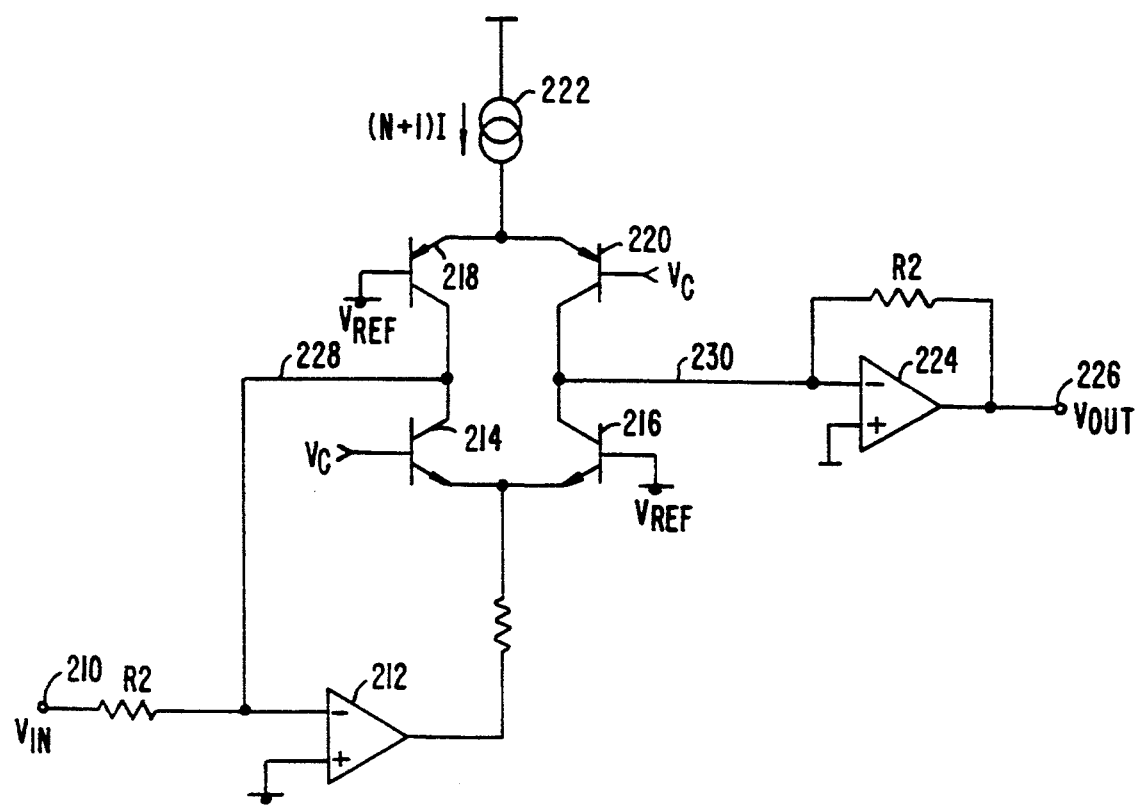
FIG. 2 is a diagram of a prior art voltage controlled attenuator.

FIG. 1 is a block diagram of a speakerphone circuit according to the present invention. A microphone 10 provides a signal through a microphone amplifier 12, a voltage controlled attenuator 14, a second amplifier 16 and a transmission circuit 18 coupled to the phone line. A receive channel provides a signal from transmission circuit 18 through a filtering amplifier 20, a voltage controlled attenuator 22 and a speaker amplifier 24 to a speaker 26. A control circuit 28 controls the gain of the transmit attenuator 14 and the receive attenuator 22.

The gain of the transmit and receive attenuators are set in a complementary manner, so that only one channel has its gain set to a high value at any one time, during the transmit or receive mode. The sum of the gains of the two channels remains constant. In the idle mode, when neither party is talking, the gains in the channels are equalized.

The control circuit operates on four primary inputs, although other secondary signals may be input to the system to refine operation. A first input is indicated as A. This signal is output from comparator 30 which receives its inputs through peak detectors 32 and 34 respectively, acting on the signal from amplifier 16 in the transmit channel and amplifier 20 in the receive channel. Similarly a comparator 36 provides signal B from a comparison of the signals provided through peak detectors 38 and 40 coupled to the output of microphone amplifier 12 and speaker amplifier 24, respectively. The other inputs, which indicate the presence of speech in a channel are from background noise detector circuits 42 and 44. These circuits, which indicate the noise level in each channel, are compared to the signal from peak detectors 38 and 34, respectively, in comparators 46 and 48 respectively, to provide signals T and R to the control circuit. The signal T indicates the presence of voice signal greater than noise, by a predetermined threshold, in the transmit channel, while the signal R indicates the presence of voice greater than noise, by a second threshold, in the receive channel.

Figure 3:
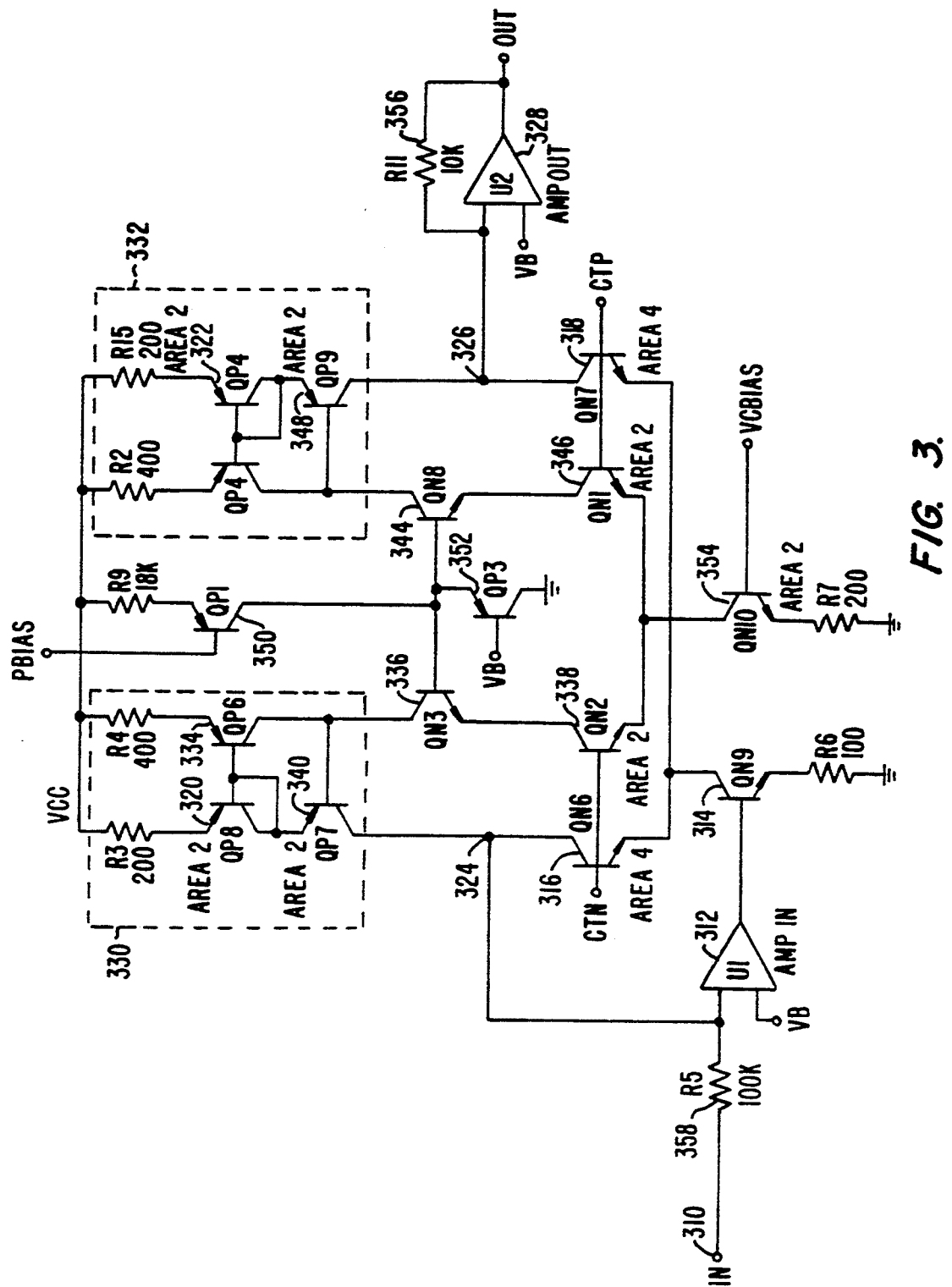
FIG. 3 is a circuit diagram of a preferred embodiment of a voltage controlled attenuator according to the present invention.

FIG. 3 is a diagram of a preferred embodiment of voltage controlled attenuator, 14 or 22 of FIG. 1. An input signal is provided on node 310 through a resistor 358 to an input amplifier 312. Amplifier 312 is connected to transistor 314, which has its collector tied to the emitters of transistors 316 and 318. The collectors of transistors 316 and 318 are coupled to the collectors of PNP transistors 340 and 348 respectively. An input node to this transistor arrangement is at point 324, and the output node is at point 326, where it is provided through an output amplifier 328.

PNP transistors 340 and 348 form parts of current mirror arrangements 330 and 332 respectively. The reference current for mirror 330, flowing in PNP transistor 334 is from NPN transistors 336 and 338. The mirror output current, flowing in PNP transistor 320 and 340 is to NPN transistor 316, and forms one part of the total current flowing in NPN transistor 314. Similarly, the reference current for current mirror 332, flowing in PNP transistor 342 is from NPN transistors 344 and 346. The mirror output current, flowing in PNP transistor 322 and 348 is to NPN transistor 318, and forms the second part of the total current flowing in NPN transistor 314. Transistors 336 and 344 are in a cascode arrangement to reduce DC feedthrough to the output of amplifier 328 by minimizing the voltage difference between the collectors of NPN transistors 338 and 346 and NPN transistors 316 and 318. The reference voltage VB to amplifiers 312 and 328 defines the DC level of the collectors of transistors 316 and 318 respectively by feedback action around amplifiers 312 and 328. PNP transistor 352 base voltage is also set at VB and thus its emitter at one vbe above VB. Transistors 336 and 344 drop one vbe from their base to emitter terminals to set the collectors of transistors 338 and 346 at the reference voltage level VB. PNP transistor 350 provides the bias current for this arrangement.

A differential control voltage CTN, CTP, is applied between the bases of transistors 318 and 346 on the positive side, and transistors 316 and 338 on the negative side. In operation the control signal acts to split the DC reference current provided by transistor 354 between transistors 338 and 346 in a ratio defined by the magnitude of the control signal, such that:

$$\frac{i2}{i1} = \exp\left(\frac{\Delta vcon}{vt}\right)$$

where:
  i1 is the current flow in 338
  i2 is the current flow in 346
  Δvcon is the differential control voltage
  vt is the threshold voltage kt/q The same ratio of DC current division occurs in transistors 316 and 318, their base voltage being common with transistors 338, 346 respectively. The level of current in transistor 314 is adjusted by feedback action through amplifier 312 to exactly match the sum of the currents through transistors 316 and 318, which is set by mirrors 330 and 332, thereby minimizing any offset voltage at the output of amplifier 328. AC current flow in transistor 314, injected by amplifier 312 from the input signal at 310, is split in a ratio which approaches the DC current division between transistors 316 and 318. The AC component of current in 318 flows to the output through resistor 356, providing signal gain or attenuation dependent on the current split defined by the applied control voltage.

$$Av = \frac{Rout}{Rin} * \frac{i2}{i1}$$

where:
Av is the AC voltage gain of the system.
Rout is feedback resistor 356 of amplifier 328
Rin is input resistor 358 of amplifier 312
The other input signals, PBIAS and VCBIAS to FIG. 3 are bias voltages necessary for correct circuit operation.

Figure 4:
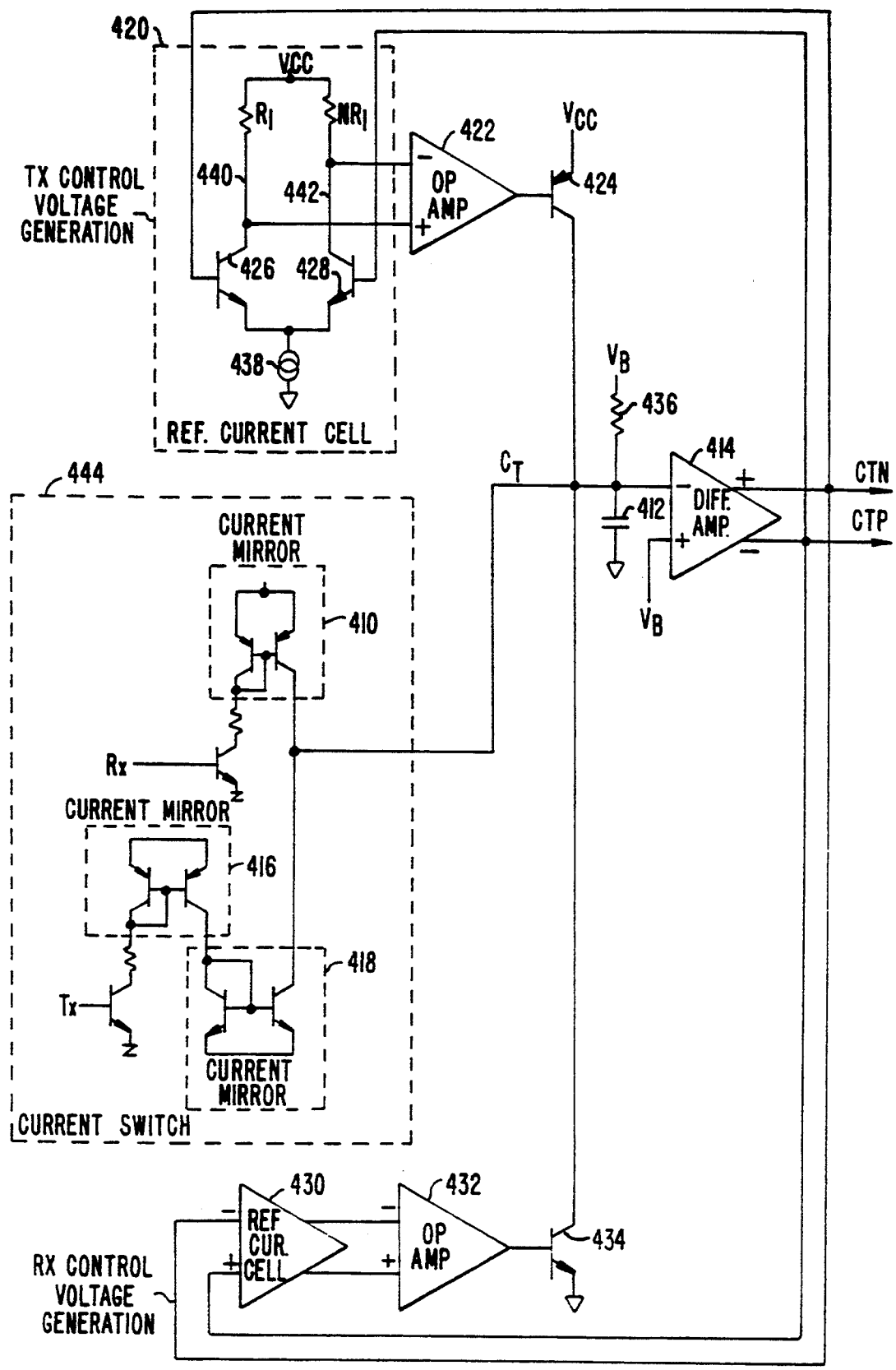
FIG. 4 is a block diagram of a control circuit which generates the control signals for the VCA of FIG. 3.

FIG. 4 is a block diagram of a control circuit for providing the differential control voltage CTN, CTP, to the VCA of FIG. 3. The sense and magnitude of signals CTN, CTP are determined by the state of the receive and transmit detect signals RX and TX. These inputs, provided by a decision circuit, indicate the presence of receive or transmit speech in the speakerphone. A capacitor 412, connected to control node CT is alternately charged or discharged by current mirrors 410 or 418, in response to signals RX or TX respectively. With neither RX or TX active, capacitor 412 is returned to a center voltage, VB, by resistor 436. Differential amplifier 414 buffers the voltage at CT to produce output signals CTN and CTP. Feedback is provided through a reference current cell 420, operational amplifier 422, and transistor 424 to regulate the negative voltage generated at CT in response to the TX input. A second feedback path is provided through reference current cell 430, operational amplifier 432 and transistor 434 to regulate the positive voltage generated at CT in response to the RX input. The feedback circuits regulate the voltage at CT to a predetermined level, defined by the ratio of resistors 440 and 442 for negative voltages, equivalent resistors for positive voltages, and the gain of differential amplifier 414. To more clearly understand the operation of the regulation mechanism, consider the operation of the transmit feedback path: upon detection of valid transmit signals by the decision circuit, input signal TX is set active, and RX inactive. Current is applied to the reference leg of current mirror 416, producing an output current from current mirror 418, and discharging capacitor 412, thereby reducing the voltage at point CT. Differential amplifier 414 tracks the voltage at CT, such that voltage CTP reduces whilst CTN increases. These signals connect to the base terminals of transistors 428 and 426 respectively, reducing the current through 428, while increasing the current through 426. The differential voltage generated across resistors 440 and 442 is applied at the input of operational amplifier 422. Due to the high gain of amplifier 422, the output voltage remains held at its maximum positive value, holding PNP transistor 424 off, and allowing capacitor 412 to discharge, until the positive input voltage of amplifier 422 falls below its negative input voltage. At this point the output voltage of amplifier 422 falls and transistor 242 is turned on preventing further discharge of capacitor 412, and fixing the voltage at CT, such that:

$$vct = -[Adm * vt * \ln(N1)]$$

where:
vct is the voltage at CT with respect to VB
Adm is the gain of differential amplifier 414
vt is the threshold voltage kt/q
N1 is the ratio of resistor 440, 442 of FIG. 4

Figure 7:
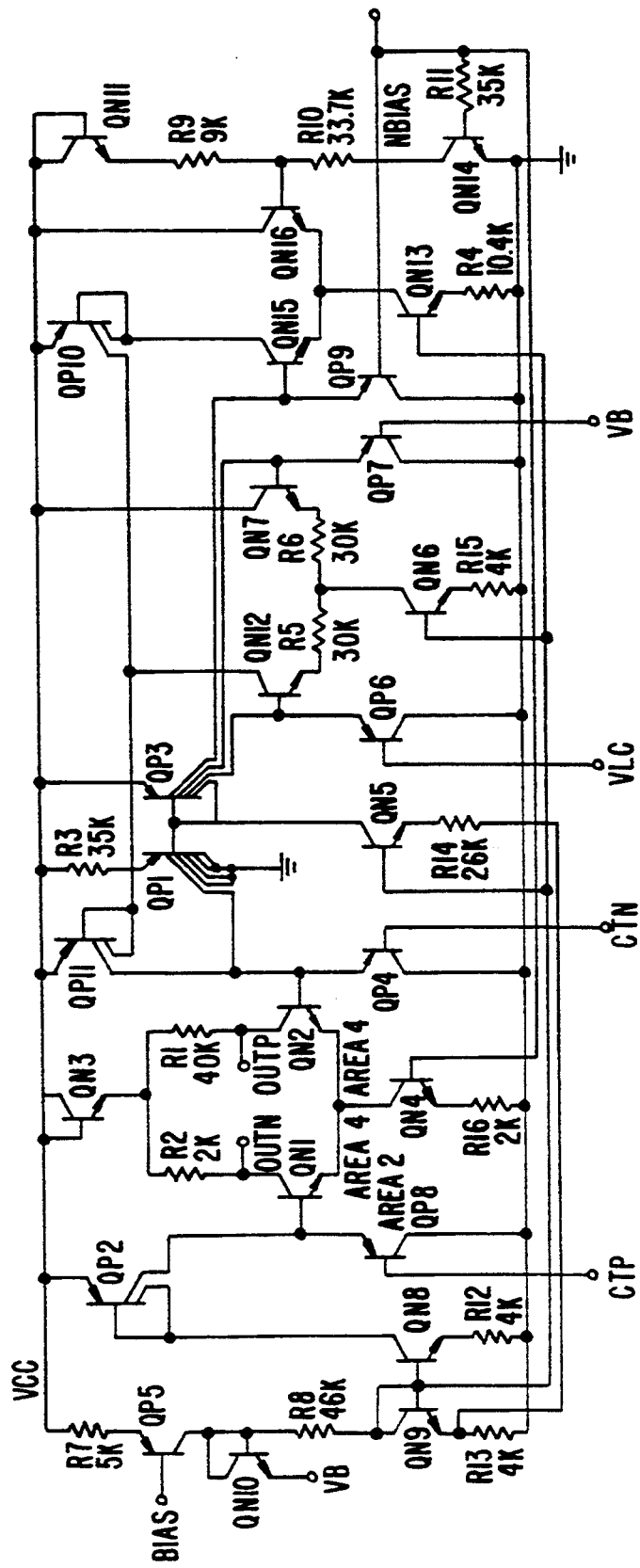
FIG. 7 is a detailed circuit diagram of the receive current setting circuit of FIG. 4.

Operation of the receive regulation mechanism is the inverse of the transmit mechanism. Upon detection of valid receive signals by the decision circuit, input signal RX is set active, and TX inactive. Current is applied to the reference leg of current mirror 410, producing an output current from current mirror 410, and charging capacitor 412, thereby increasing the voltage at point CT. Elements 430, 432 and 434 form a second feedback path to set the magnitude of the positive voltage developed at CT such that:

$$vct = Adm * vt * \ln(N2)$$

where:
vct is the voltage at CT with respect to VB
Adm is the gain of differential amplifier 414
vt is the threshold voltage kt/q
N2 is the ratio of resistor R1, R2 of FIG. 7

Figure 5:
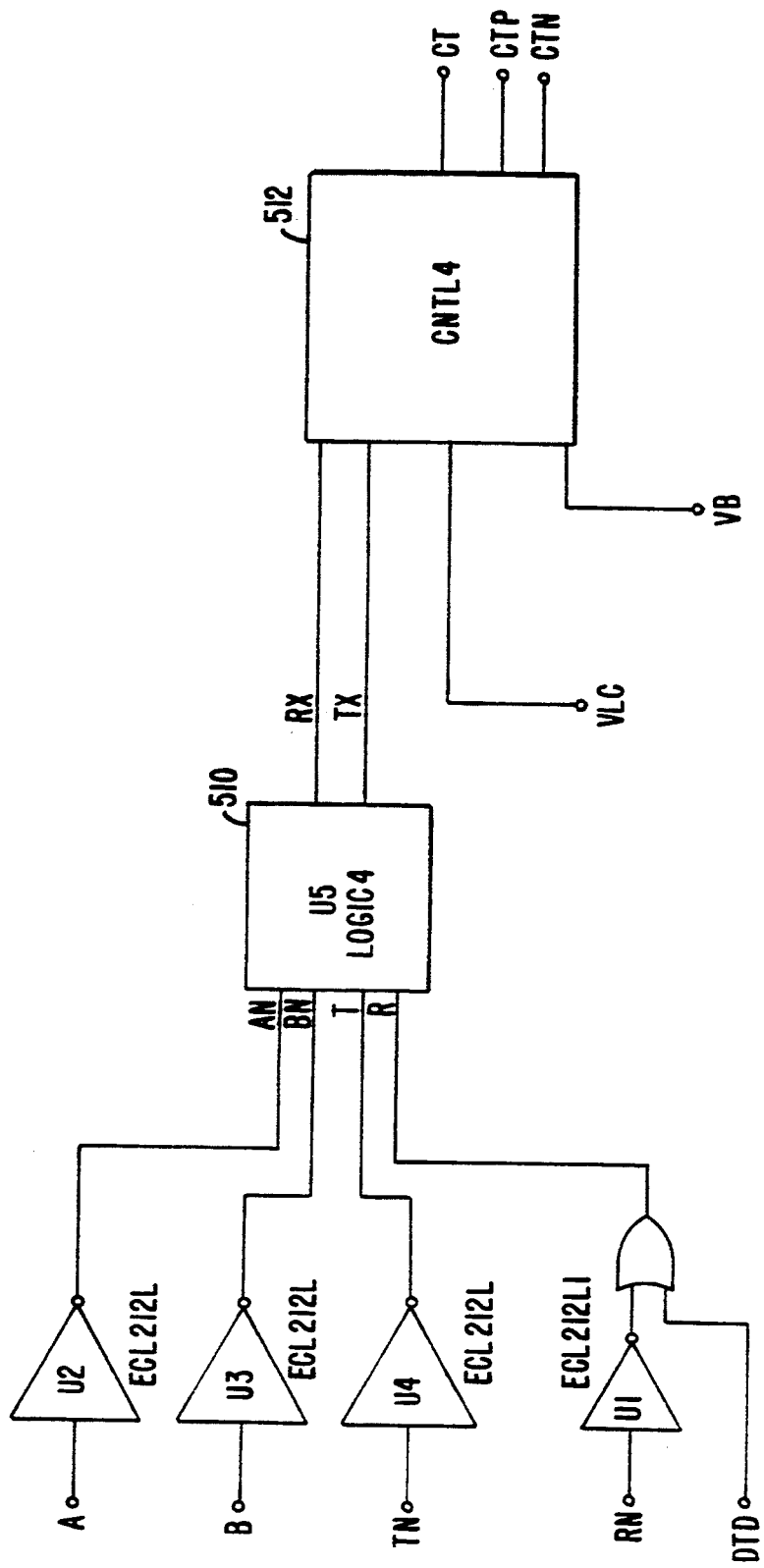
FIG. 5 is a block diagram of the logic circuit for generating the receive and transmit detect signals provided to the circuit of FIG. 4.

The generation of the RX and TX signals can be seen from the diagram of FIG. 5, which shows A and B inputs, and TN and RN inputs (reflecting $\overline{T}$ and $\overline{R}$), which are provided by elements of the circuit given in FIG. 1. These form input signals to logic block 510, which generates the RX and TX signals input to control circuit 512, which is the control circuit of FIG. 4.

Figure 6:
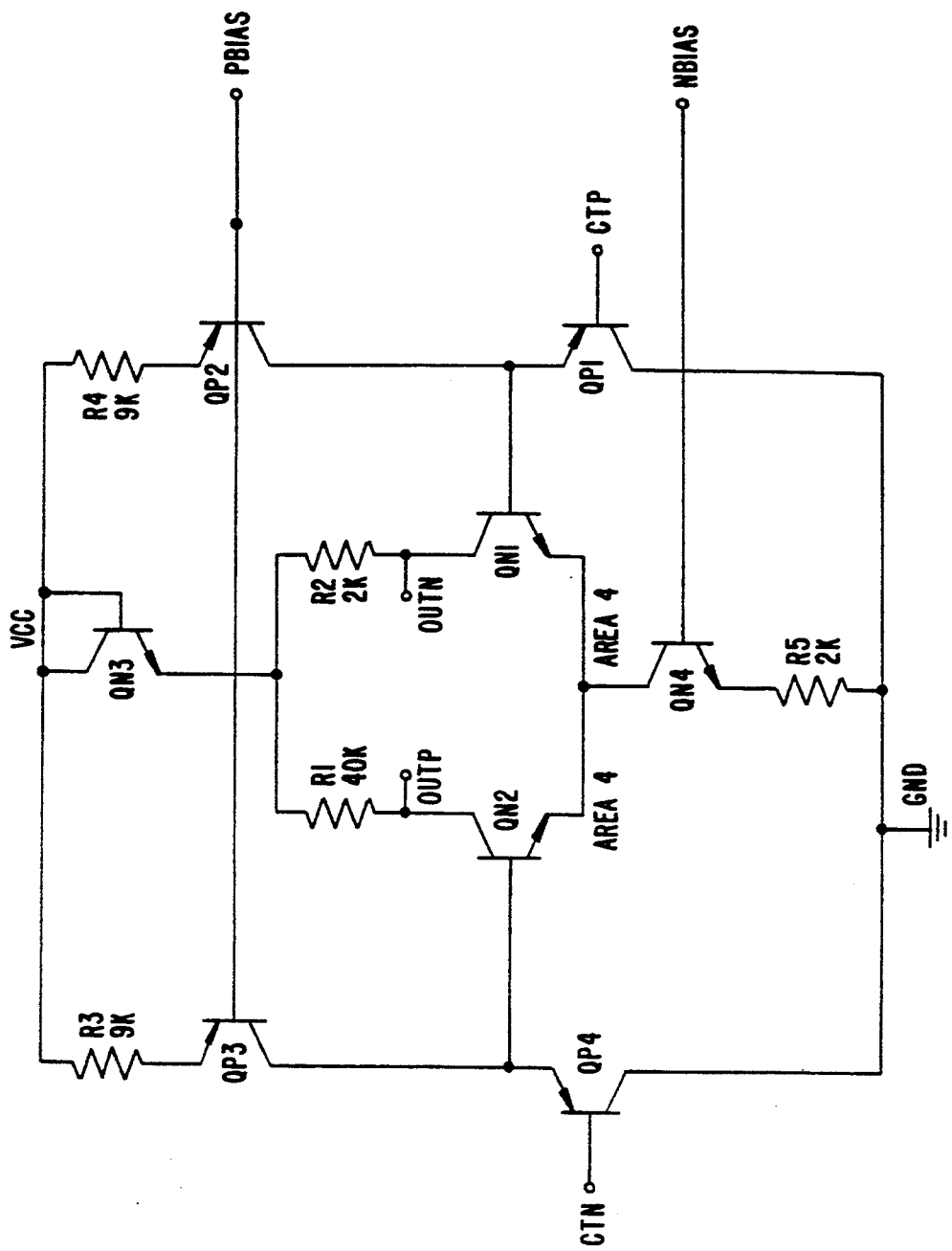
FIG. 6 is a circuit diagram of the transmit current setting circuit of FIG. 4.
Figure 8:
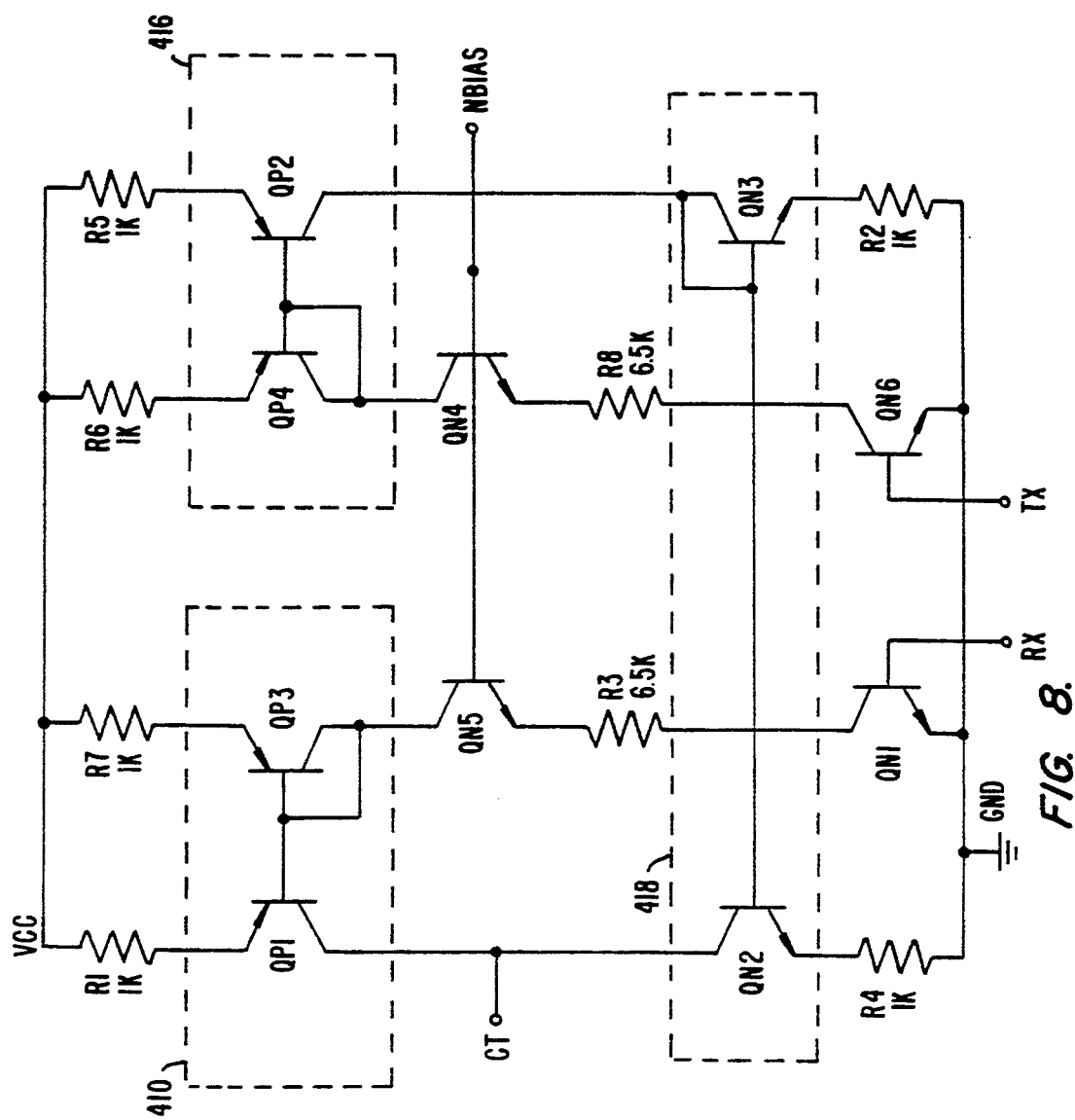
FIG. 8 is a circuit diagram of the current switching circuit of FIG. 4.

The current switching circuit 444, connected to node CT in FIG. 4 is given in more detail in FIG. 8. The input signal NBIAS is a bias voltage necessary for correct circuit operation. FIG. 6 shows a circuit level diagrams of the transmit reference current cell, 420. As may be determined from FIG. 6, the ratio of resistors 440 and 442 is 2 K:40 K, or an N of 20. A similar ratio is used in the receive current cell.

As will be understood by those familiar with the art, the present invention may be embodied in other specific forms without departing from the spirit or essential characteristics thereof. Accordingly the disclosure of the preferred embodiment of the invention is intended to be illustrative, but not limiting, of the scope of the invention which is set forth in the following claims.

What is claimed is:

1. A voltage controlled attenuator for a speakerphone, comprising:
first and second NPN transistors having emitters coupled together;
a first current source coupled to said emitters of said first and second NPN transistors;
a first PNP transistor having a collector coupled to a collector of said first NPN transistor;
a second PNP transistor having a collector and base coupled to an emitter of said first PNP transistor, and an emitter coupled to a first voltage source;
a third PNP transistor having a collector coupled to a collector of said second NPN transistor;
a fourth PNP transistor having a collector and base coupled to an emitter of said third PNP transistor, and an emitter coupled to said first voltage source;
an input to said attenuator coupled to said collector of said first NPN transistor for providing an analog representation of a voice signal to said first NPN transistor;
an output to said attenuator coupled to said collector of said second NPN transistor;
a first current mirror having a first leg coupled to a base of said first PNP transistor, said first and second PNP transistors being a second leg of said first current mirror;
a second current mirror having a first leg coupled to a base of said third PNP transistor, said third and fourth PNP transistors being a second leg of said second current mirror;

first and second control inputs coupled to said first legs of said first and second current mirrors, respectively;

wherein said first and second control inputs are coupled to the bases of third and fourth NPN transistors coupled to said first legs of said current mirrors;

an input amplifier having an input coupled to said input of said attenuator and an output coupled to the base of a fifth NPN transistor in said first current source, said input amplifier providing a feedback connection between said collector of said first NPN transistor and said first current source; and a second current source having a sixth NPN transistor with a base coupled to a fixed bias voltage and a collector coupled to the emitters of said third and fourth NPN transistors.

2. The voltage controlled attenuator of claim 1 further comprising:

a first resistor having a terminal connected to an emitter of said second PNP transistor and a second terminal connected to a first voltage source; and a second resistor having a terminal connected to an emitter of said fourth PNP transistor and a second terminal connected to said first voltage source.

3. The voltage controlled attenuator of claim 1 wherein said first control input is also coupled to a base of said first NPN transistor and said second control input is coupled to a base of said second NPN transistor.

4. The voltage controlled attenuator of claim 3 wherein said first and second control inputs are a differential control voltage input.

5. The voltage controlled attenuator of claim 1, wherein said first control input is also coupled to a base of said first NPN transistor and said second control input is also coupled to a base of said second NPN transistor.

6. The voltage controlled attenuator of claim 5 wherein said first and second control inputs are a differential control voltage input.

7. The voltage controlled attenuator of claim 6 further comprising:

a resistor having a first terminal connected to said input of said input amplifier and a second terminal available as a signal input.

8. The voltage controlled attenuator of claim 7 further comprising:

an output amplifier having an input coupled to said output of said attenuator; and a resistor having a first terminal connected to said input of said output amplifier and a second terminal connected to an output of said output amplifier.

* * * * *